US008743612B2

(12) United States Patent
Choi et al.

(10) Patent No.: US 8,743,612 B2
(45) Date of Patent: Jun. 3, 2014

(54) THREE-DIMENSIONAL NON-VOLATILE MEMORY DEVICE

(75) Inventors: Eun Seok Choi, Gyeonggi-do (KR); Jung Ryul Ahn, Gyeonggi-do (KR); Se Hoon Kim, Gyeonggi-do (KR); Yong Dae Park, Gyeonggi-do (KR); In Geun Lim, Gyeonggi-do (KR); Jung Seok Oh, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 76 days.

(21) Appl. No.: 13/605,942

(22) Filed: Sep. 6, 2012

(65) Prior Publication Data

US 2013/0194869 A1    Aug. 1, 2013

(30) Foreign Application Priority Data

Jan. 31, 2012 (KR) .................. 10-2012-0009533

(51) Int. Cl.
*G11C 16/04* (2006.01)
(52) U.S. Cl.
CPC .................................. *G11C 16/0483* (2013.01)
USPC ................... 365/185.11; 365/63; 365/185.17; 365/185.18
(58) Field of Classification Search
CPC ........... G11C 11/5628; G11C 16/0483; G11C 16/10; G11C 16/26; G11C 16/3418
USPC .............. 365/185.11, 185.17, 185.18, 63, 72, 365/130
See application file for complete search history.

(56) References Cited

U.S. PATENT DOCUMENTS

| 7,440,321 | B2 * | 10/2008 | Aritome ................... 365/185.17 |
| 8,274,827 | B2 * | 9/2012 | Shirota et al. ............ 365/185.17 |
| 8,335,111 | B2 * | 12/2012 | Fukuzumi et al. ........ 365/185.18 |
| 8,432,746 | B2 * | 4/2013 | Hung et al. .............. 365/189.05 |
| 8,446,767 | B2 * | 5/2013 | Tang et al. ............... 365/185.17 |
| 8,526,241 | B2 * | 9/2013 | Shirakawa ............... 365/185.23 |
| 8,582,369 | B2 * | 11/2013 | Nagadomi et al. ........ 365/185.22 |
| 8,649,225 | B2 * | 2/2014 | Nagadomi ............... 365/185.29 |
| 2011/0216604 | A1 | 9/2011 | Mikajiri et al. |

FOREIGN PATENT DOCUMENTS

| KR | 1020120130939 | 12/2012 |
| KR | 1020130006272 | 1/2013 |

\* cited by examiner

*Primary Examiner* — Tan T. Nguyen
(74) *Attorney, Agent, or Firm* — IP & T Group LLP

(57) ABSTRACT

A three-dimensional (3-D) non-volatile memory device according to embodiment of the present invention includes a plurality of bit lines, at least one string row extending in a first direction coupled to the bit lines and including 2N strings, wherein the N includes a natural number, a common source selection line configured to control source selection transistors of the 2N strings included in a memory block, a first common drain selection line configured to control drain selection transistors of a first string and a 2N-th string among the 2N strings included in a memory block, and N−1 second common drain selection lines configured to control drain selection transistors of adjacent strings in the first direction among remaining strings other than the first string and the 2N-th string.

23 Claims, 14 Drawing Sheets

THREE-DIMENSIONAL NON-VOLATILE MEMORY DEVICE

CROSS-REFERENCE TO RELATED APPLICATION

Priority is claimed to Korean patent application number 10-2012-0009533 filed on Jan. 31, 2012, the entire disclosure of which is incorporated herein by reference in its entirety.

BACKGROUND

1. Field of Invention

Embodiments of the present invention relate to a semiconductor device and, more particularly, to a non-volatile memory device having memory cells stacked in three dimensions.

2. Description of Related Art

A non-volatile memory device retains data even in the absence of power supply. Two-dimensional memory devices in which memory cells are fabricated in a single layer over a silicon substrate have reached physical limits in increasing their degree of integration. Accordingly, three-dimensional non-volatile memory devices in which memory cells are stacked in a vertical direction over a silicon substrate have been proposed.

The structure and features of a conventional three-dimensional (3-D) memory device are described below with reference to the accompanying drawings.

FIG. 1 is a perspective view illustrating the structure of a conventional 3-D non-volatile memory device. In FIG. 1, interlayer insulating layers are not depicted for illustration purposes.

As shown in FIG. 1, a conventional non-volatile memory device may include U-shaped channel layers CH that are arranged in a first direction I-I' and a second direction II-II' crossing the first direction I-I'. Here, each of the U-shaped channel layers CH may include a pipe channel layer P_CH and a pair of a source side channel layer S_CH and a drain side channel layer D_CH. The pipe channel layer P_CH may be formed in a pipe gate PG. The source side channel layer S_CH and the drain side channel layer D_CH may be coupled to the pipe channel layer P_CH.

In addition, the memory device may include source side word line layers S_WL stacked over the pipe gate PG along the source side channel layer S_CH and drain side word line layers D_WL stacked over the pipe gate PG along the drain side channel layer D_CH. Here, a source selection line layer SSL may be stacked on top of the source side word line layers S_WL, and a drain selection line layer DSL may be stacked on top of the drain side word line layers D_WL.

According to the above-described structure of the memory device, memory cells MC may be stacked along the U-shaped channel layer CH. A drain selection transistor DST and a source selection transistor SST may be formed at both ends of the U-shaped channel layer CH. Therefore, strings having a U shape may be arranged.

In addition, the memory device may include bit line layers BL and a source line layer SL. The bit line layers BL may be coupled to the drain side channel layers D_CH and extend in the first direction I-I'. The source line layer SL may be coupled to the source side channel layer S_CH and extend in the second direction II-II'.

The conventional 3-D non-volatile memory device may be configured to perform a program operation and a read operation by separately controlling voltages of the source selection line layer SSL and the drain selection line layer DSL of each string, which may make a operating method thereof complicated. In addition, since a stacked structure of the word line layers and the selection line layers has a great height to increase storage capacities of the memory device, the stacked structure may lean.

BRIEF SUMMARY

An embodiment of the present invention relates to a three-dimensional non-volatile memory device operated by a simple method.

A three-dimensional (3-D) non-volatile memory device according to an embodiment of the present invention includes a plurality of bit lines, at least one string row extending in a first direction coupled to the bit lines and including 2N strings, wherein the N includes a natural number, a common source selection line configured to control source selection transistors of the 2N strings included in a memory block, a first common drain selection line configured to control drain selection transistors of a first string and a 2N-th string among the 2N strings included in a memory block, and N−1 second common drain selection lines configured to control drain selection transistors of adjacent strings in the first direction among remaining strings other than the first string and the 2N-th string.

A three-dimensional (3-D) non-volatile memory device according to another embodiment of the present invention includes a plurality of bit lines, at least one string row including a plurality of strings and coupled to the bit lines, a plurality of common source selection lines coupled to source selection transistors of adjacent strings among the plurality of strings included in the string row, and a plurality of common drain selection lines coupled to drain selection transistors of at least two of the plurality of strings included in the string row.

A three-dimensional (3-D) non-volatile memory device according to yet another embodiment of the present invention includes channel layers each including a pipe channel layer and a pair of a source side channel layer and a drain side channel layer coupled to the pipe channel layer, wherein the channel layers are arranged in a first direction and a second direction crossing the first direction to have the source and drain side channel layers thereof adjacent to source and drain side channel layers of adjacent channel layers, respectively, common source selection line layers surrounding adjacent source side channel layers, among the source side channel layers of the channel layers, wherein the common source selection line layers are formed in at least one level, first common drain selection line layers surrounding drain side channel layers adjacent at edges of a memory block, wherein the first common drain selection line layers are formed in at least one level, and second common drain selection line layers surrounding adjacent drain side channel layers, among the drain side channel layers of the channel layers, other than the drain side channel layers located at the edges of a memory block, wherein the second common drain selection line layers are formed in at least one level.

DESCRIPTION OF EMBODIMENTS

Hereinafter, various embodiments of the present disclosure will be described in detail with reference to the accompanying drawings. The figures are provided to enable those of ordinary skill in the art to make and use the present invention according to the embodiments of the present invention.

Figure 1:
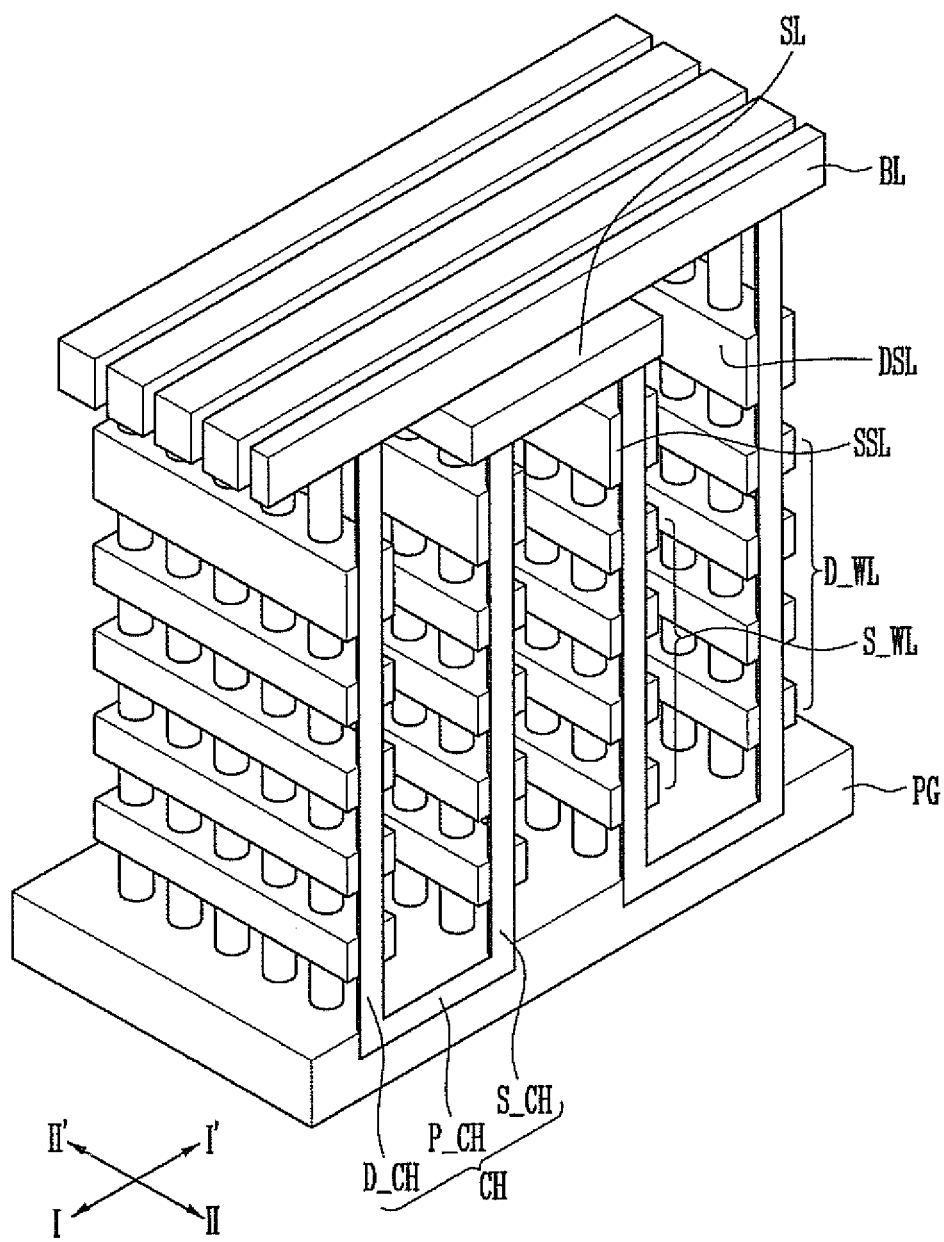
FIG. 1 is a perspective view illustrating the structure of a conventional three-dimensional (3-D) non-volatile memory device.
Figure 2:
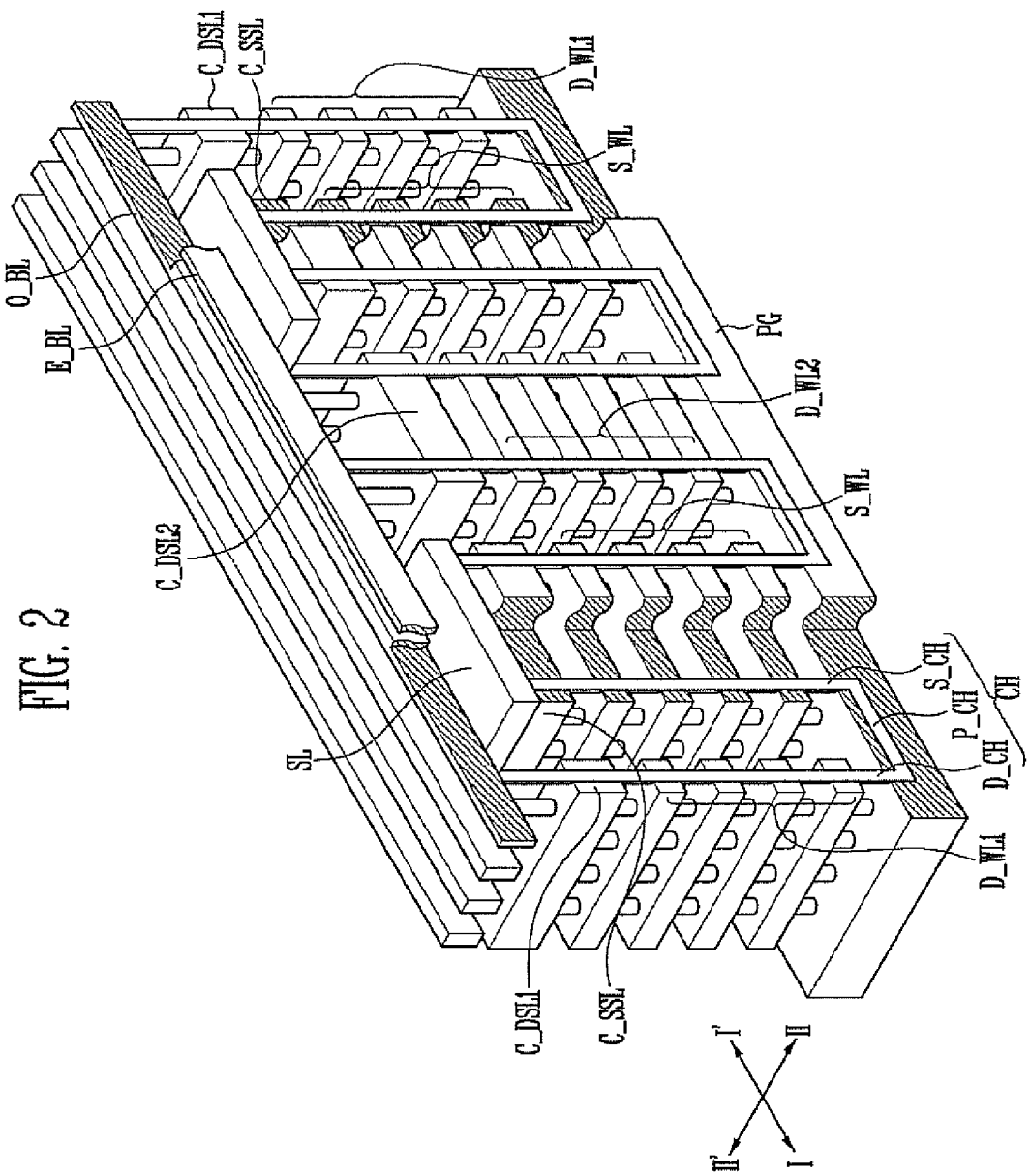
FIG. 2 is a perspective view illustrating the structure of a semiconductor device according to an embodiment of the present invention.

FIG. 2 is a perspective view illustrating the structure of a semiconductor device according to an embodiment of the present invention. In FIG. 2, interlayer insulating layers are not depicted for illustration purposes.

As show in FIG. 2, a semiconductor device according to an embodiment of the present invention may include channel layers CH, common source selection line layers C_SSL, first common drain selection line layers C_DSL1 and second common drain selection line layers C_DSL2. Each of the channel layers CH may include a pipe channel layer P_CH and a pair of a source side channel layer S_CH and a drain side channel layer D_CH coupled to the pipe channel layer P_CH. Each of the channel layers CH may have a U-shape. The channel layers CH are arranged in first and second directions I-I' and II-II' to have the source side channel layer S_CH and the drain side channel layer D_CH thereof adjacent to source side channel layers S_CH and drain side channel layers D_CH of adjacent channel layers CH, respectively. Here, the channel layers CH arranged in the first direction I-I' may form a single string row and have the drain side channel layers D-CH at the both sides. The common source selection line layers C_SSL may surround adjacent source side channel layers S_CH of the channel layers CH. The common source selection line layers C_SSL may be formed on the same level or stacked at different levels. The first common drain selection line layers C_DSL1 may surround adjacent drain side channel layers D_CH of the channel layers CH located at the both edges of a memory block and be formed at the same level or stacked at different levels. The second common drain selection line layers C_DSL2 may surround other drain side channel layers D_CH of the channel layers CH. The second common drain selection line layers C_DSL2 may be formed on the same level or stacked at different levels.

In addition, the channel layers CH arranged in couple rows of the first direction I-I' may form the single string row. Here, each string row may extend in the first direction I-I' and in a zigzag pattern.

The common source selection line layers C_SSL may surround the source side channel layers S_CH of the adjacent channel layers CH in the first direction I-I'. The common source selection line layers C_SSL may be formed on the same level or stacked at different levels. The first common drain selection line layers C_DSL1 may surround the drain side channel layers D_CH of the channel layers CH located at the edges of the memory block. The first common drain selection line layers C_DSL1 may be formed on the same level or stacked at different levels. In addition, the second common drain selection line layers C_DSL2 may surround the drain side channel layers D_CH of the adjacent channel layers CH in the first direction I-I'. The second common drain selection line layers C_DSL2 may be formed on the same level or stacked at different levels.

The memory device may further include a plurality of conductive layers stacked at different levels between a pipe gate layer PG and common selection line layers C_SSL, C_DSL1 and C_DSL2. The conductive layers may function as the source side word line layers S_WL or the drain side word line layers D_WL.

First and second drain side word line layers D_WL1 and D_WL2 may be stacked at different levels between the pipe gate layer PG and the first and second common drain selection line layers C_DSL1 and C_DSL2 (C_DSL), respectively. In addition, the source side word line layers S_WL may be stacked at different levels between the pipe gate layer PG and the common source selection line layers C_SSL. Here, the source side word line layers S_WL may have the same patterns as the common source selection line layers C_SSL. The first and second drain side word line layers D_WL1 and D_WL2 may have the same patterns as the first and second common drain selection line layers C_DSL1 and C_DSL2, respectively.

For example, the source side word line layers S_WL may surround the source side channel layers S_CH of the adjacent channel layers CH in the first direction I-I' and be stacked at different levels. The first drain side word line layers D_WL1 may surround the drain side channel layers D_CH of the channel layers CH located at the edges of the memory block and be stacked at different levels. In addition, the second drain side word line layers D_WL2 may surround the drain side channel layers D_CH of the adjacent channel layers CH in the first direction I-I' and be stacked at different levels.

For reference, the source side word line layers S_WL may have different patterns from the common source selection line layer C_SSL. In addition, the first and second drain side word line layers D_WL1 and D_WL2 may have different patterns from the first and second common drain selection line layers C_DSL1 and C_DSL2, respectively. For example, each of the source side word line layers S_WL and each of the second drain side word line layers D_WL2 may have the same width as each of the first drain side word line layers D_WL1, so that the source side word line layers S_WL and the second drain side word line layers D_WL2 each have a small width.

In addition, the memory device may further include source line layers SL and bit line layers O_BL and E_BL. The source line layers SL may be formed over the common source selection line layers C_SSL. The bit line layers O_BL and E_BL may extend in parallel along the first direction I-I'. Here, a single string row may be coupled to at least two bit line layers O_BL and E_BL. For example, when the string row is coupled to two bit line layers O_BL and E_BL, the odd bit line layer O_BL may be coupled to drain side channel layers D_CH of odd channel layers CH, and the even bit line layer E_BL may be coupled to drain side channel layers D_CH of even channel layers CH.

According to the above-described structure, memory cells MC may be stacked along each of the channel layers CH having a U-shape. A drain selection transistor DST and a source selection transistor SST may be provided at both ends of the channel layer CH having the U-shape. Therefore, strings having a U-shape may be arranged.

In addition, selection line layers or word line layers of strings located in the memory block may merge with selection line layers or word line layers of adjacent strings to thus form pattern layers. Therefore, the number of slits may be reduced less than half as compared with a case in which the selection line layers or the word line layers of the strings are separated from each other, thus reducing cell area. In addition, since widths of the pattern layers are increased, a stacked structure may be prevented from leaning.

In addition, in the strings at the edge of the memory block, the first drain side word line layers D_WL1 and the first common drain selection line layers C_DSL1 that may surround the drain side channel layers D_CH of the corresponding strings. In other words, since selection line layers or word line layers of strings located at the boundaries of adjacent memory blocks are separated from each other, memory cells may be operated on each memory block.

A method of manufacturing a semiconductor device according to an embodiment of the present invention will be described below.

First, the pipe gate layer PG may be etched to form trenches such that the trenches are arranged in the first direction I-I' and the second direction II-II'. Here, a trench row extending in the first direction I-I' may be arranged in a zigzag pattern. Subsequently, a sacrificial layer may be formed in each of the trenches, and a capping layer may be formed over the pipe gate layer PG in which the sacrificial layer is formed. Here, the capping layer may include the same material as the pipe gate layer PG. The capping layer may function as a pipe gate when the memory device is operated, as well as an etch stop layer in subsequent process of forming slits.

Subsequently, first material layers and second material layers may be alternately formed over the capping layer. Here, the first material layers may be provided to form word line layers or selection line layers, and the second material layers may be provided to form interlayer insulating layers that insulate the word line layers or the selection line layers that are stacked.

For example, the first material layer may comprise a conductive layer such as a polysilicon layer, and the second material layer may comprise an insulating layer such as an oxide layer. In another example, the first material layer may comprise a conductive layer such as a doped polysilicon layer and a doped amorphous silicon layer, and the second material layer may comprise a sacrificial layer such as an undoped polysilicon layer and an undoped amorphous silicon layer. In yet another example, the first material layer may comprise a sacrificial layer such as a nitride layer, and the second material layer may comprise an insulating layer such as an oxide layer.

Subsequently, the first material layers and the second material layers may be etched to form channel holes so that the channel holes may be coupled to each of the trenches. For example, a pair of channel holes may be coupled to each trench.

Subsequently, after the sacrificial layer exposed at a bottom surface of each of the channel holes is removed, a memory layer may be formed along an inner surface of each trench and inner surfaces of a pair of channel holes coupled to each trench. In addition, the memory layer may comprise a charge blocking layer, a charge trap layer and a tunnel insulating layer.

Subsequently, a semiconductor layer may be formed over the memory layer. In this manner, U-shaped channel layers CH may be formed. Here, each of the U-shaped channel layers CH may comprise the pipe channel layer P_CH formed in the pipe gate layer PG and a pair of the source side channel layer S_CH and the drain side channel layer D_CH coupled to the pipe channel layer P_CH.

Subsequently, the first material layers and the second material layers between the source side channel layers S_CH and the drain side channel layers D_CH may be etched to form first slits. Here, in order to prevent strings at the boundaries of memory blocks from sharing the first common drain selection line layer C_DSL1, second slits may be additionally formed at the boundaries of the memory blocks. More specifically, the second slits may be formed between the drain side channel layers D_CH of the strings at the edges of the memory blocks.

As a result, the first material layers may be patterned to form the first and second common drain selection line layers C_DSL1 and C_DSL2, the common source selection line layers C_SSL, the first and second drain side word line layers D_WL1 and D_WL2 and the source side word line layers S_WL.

The shapes of the drain side word line layers (D_WL1 and D_WL2) may vary, depending on the depth of the second slits. For example, when each of the second slits has such a depth that the first material layers may be completely etched, the first drain side word line layers D_WL1 may have the same width as the first common drain selection line layers C_DSL1 so that each of the first drain side word line layers D_WL1 has a small width. In addition, when the second slits have such a depth that only the first material layers corresponding to selected lines are etched, the first drain side word line layers D_WL1 may have the same width as the second drain side word line layers D_WL2 so that each of the first drain side word line layers D_WL1 has a large width. Here, the drain side channel layers D_CH of the strings at the boundaries of the adjacent memory blocks may pass through the same first drain side word line layers D_WL1. More specifically, the strings at the boundaries of the adjacent memory blocks may share the same first drain side word line layers D_WL1.

Subsequently, an insulating layer may be formed in the first and second slits. Here, additional processes may be performed prior to the process of forming the insulating layer in the first and second slits, depending on materials of the first material layers and the second material layers.

For example, when the first material layers comprise conductive layers, and the second material layers comprise insulating layers, the first material layers exposed through the first and second slits may be silicided, and the insulating layer may be formed in the first and second slits, thereby completing processes of forming memory cells.

In another example, when the first material layers comprise conductive layers, and the second material layers comprise sacrificial layers, the second material layers exposed through the first and second slits may be removed. Subsequently, the insulating layer may be formed in the first and second slits and regions from which the second material layers are removed, thereby completing processes of forming memory cells. Here, depending on deposition conditions of the insulating layer, an air gap may be formed in the first and second slits and the regions from which the second material layers are removed.

In yet another example, when the first material layers comprise sacrificial layers, and the second material layers comprise insulating layers, the first material layers exposed through the first and second slits may be removed. Subsequently, a charge blocking layer that comprises an aluminum oxide layer ($Al_2O_3$), or a charge blocking layer that has a stacked structure of an oxide layer and an aluminum oxide layer ($Al_2O_3$) may be formed in regions from which the first material layers are removed. Subsequently, conductive layers including tungsten (W) may be formed in the regions to form word lines and selection lines. Here, before the charge blocking layer is additionally formed, the charge blocking layer in each of the channel holes that may be damaged when the first material layers are removed may be removed. Subsequently, the insulating layer may be formed in the first and second slits, thereby completing processes of forming memory cells.

Subsequently, source contact plugs may be formed so that the source contact plugs are coupled to source side channel layers S_CH. The source line layers SL may be subsequently formed so that the source line layers SL extend in parallel along the second direction II-II'. In addition, drain contact plugs may be formed so that the drain contact plugs are coupled to drain side channels D_CH. The bit line layers O_BL and E_BL may be subsequently formed so that the bit line layers O_BL and E_BL extend in parallel along the first direction I-I'.

Figure 3A:
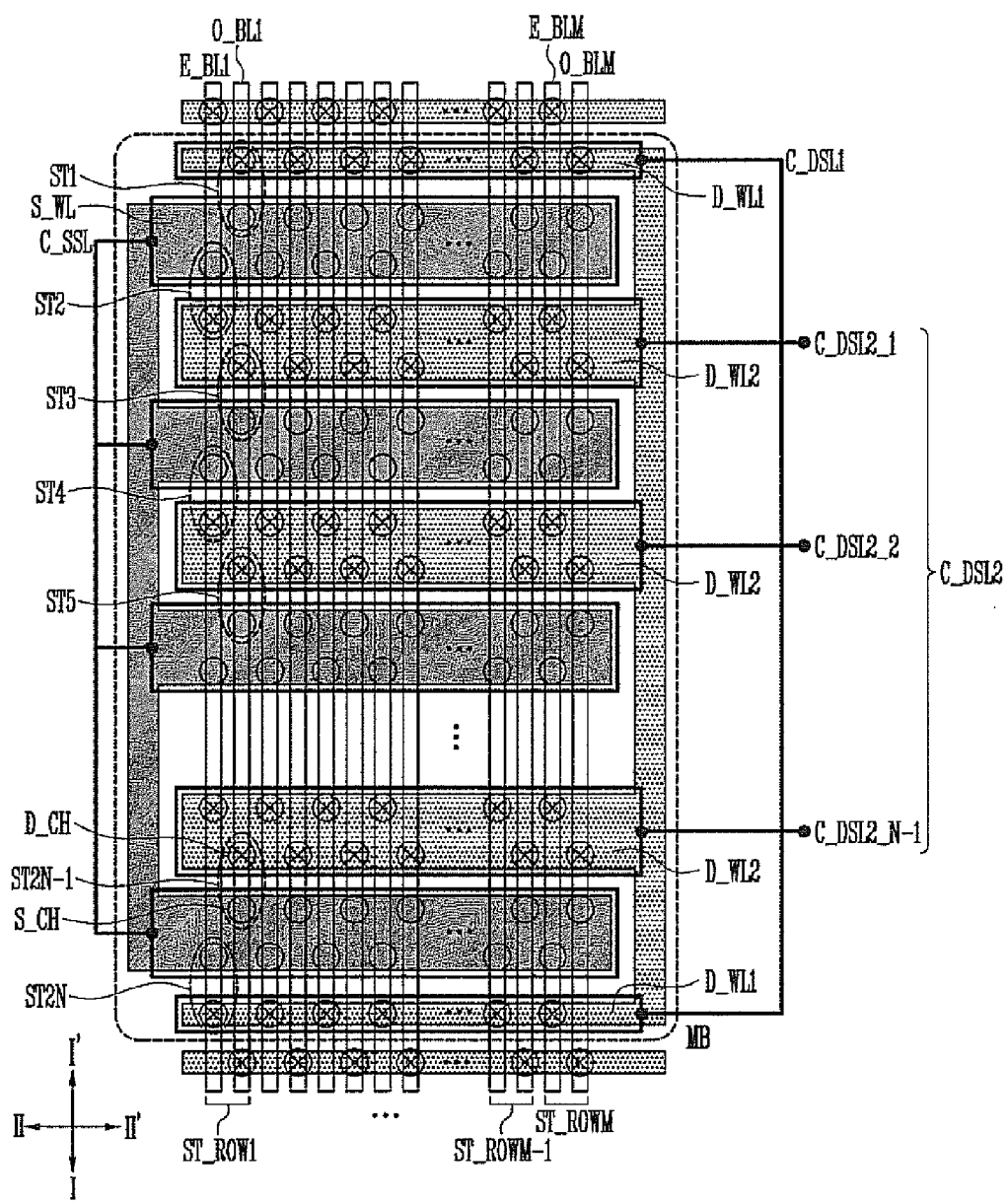
FIGS. 3A and 3B are views illustrating the structure of a semiconductor device according to a first embodiment of the present invention.
Figure 3B:
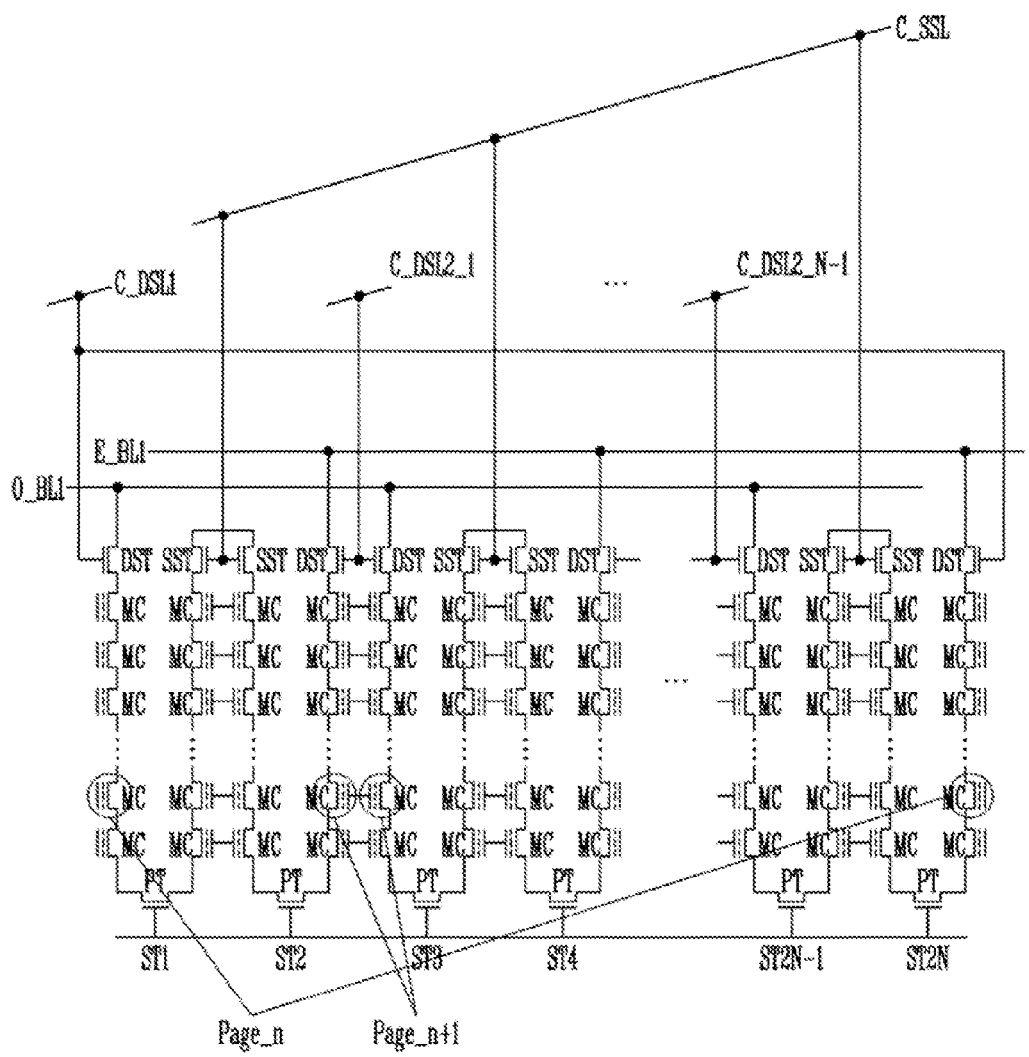

FIGS. 3A and 3B are views illustrating the structure of a semiconductor device according to a first embodiment of the present invention. FIG. 3A is a layout view of a cell array. FIG. 3B is a circuit diagram of a portion of the cell array of FIG. 3A.

As shown in FIG. 3A, one of the memory blocks MB of the semiconductor device according to the first embodiment of the present invention may include M string rows ST_ROW1 to ST_ROWM that extend in the first direction I-I'. In addition, each of the string rows ST_ROW1 to ST_ROWM may include 2N strings ST1 to ST2N.

In particular, according to the first embodiment, first to 2N-th strings ST1 to ST2N, included in the string row ST_ROW1, may be alternately coupled to odd and even bit lines O_BL1 and E_BL1. Therefore, when first to 2N-th channel layers of the first to 2N-th strings ST1 to ST2N are arranged in a sequential manner, the first channel layer may be aligned with the third channel layer while the second channel layer may be aligned with the fourth channel layer to have an offset to the alignment of the first and third channel layers.

The first drain side word line layers D_WL1 may be arranged at the edges of the memory block, and the source side word line layers S_WL and the second drain side word line layers D_WL2 may alternate with each other at the center of the memory block. Here, one set of ends of the source side word line layers S_WL may be coupled to each other, and one set of ends of the drain side word line layers (D_WL1 and D_WL2) may be coupled to each other.

In addition, the first common drain selection line layers C_DSL1 may be arranged at the edges of the memory block. The common source selection line layers C_SSL and the second common drain selection line layers C_DSL2 may be alternately arranged at the center of the memory block. Here, one set of ends of the common source selection line layers C_SSL may be coupled to each other, and one set of ends of the first common drain selection line layers C_DSL1 may be coupled to each other. In addition, the second common drain selection line layers C_DSL2 may be separated from each other. According to the above-described structure, the number of metal wires coupled to the common source selection line layers C_SSL and the common drain selection line layers C_DSL1 and C_DSL2 may be reduced compared with the conventional memory device.

As shown in FIG. 3B, each of the string rows ST_ROW1 to ST_ROW2N of the semiconductor device according to the first embodiment of the present invention may include the 2N strings ST1 to ST2N. In addition, each of the strings ST1 to ST2N may include at least one drain selection transistor DST, the memory cells MC including a pipe transistor PT and at least one source selection transistor SST that are coupled in series with each other. Here, the memory cells MC may include drain side memory cells MC stacked along the drain side channels D_CH and source side memory cells MC stacked along the source side channels S_CH. The pipe transistor PT may be coupled between the drain side memory cells MC and the source side memory cells MC.

The semiconductor device may further include a plurality of bit lines O_BL1 and E_BL1 that are coupled to the string row ST_ROW1. For example, when the string row ST_ROW1 includes even strings ST2, ST4 . . . ST2N and odd strings ST1, ST3 . . . ST2N−1, the even strings ST2, ST4 . . . ST2N may be coupled to the even bit line E_BL1, and the odd strings ST1, ST3 . . . ST2N−1 may be coupled to the odd bit lines O_BL1.

The semiconductor device may further include one common source selection line C_SSL that commonly controls the source selection transistors SST of the strings ST1 to ST2N included in the memory block MB. Therefore, during a program operation or a read operation, the common source selection line layer C_SSL may apply the same voltage to gate electrodes of the source selection transistors SST to turn on or off the source selection transistors SST.

In addition, the semiconductor device may further include a plurality of common drain selection lines C_DSL1 and C_DSL2 that commonly control the drain selection transistors DST of at least two of the strings ST1 to ST2N included in the memory block MB. In particular, the semiconductor device according to the first embodiment of the present invention may include one first common drain selection line layer C_DSL1 and N−1 second common drain selection line layers C_DSL2. The first common drain selection line layer C_DSL1 may commonly control the drain selection transistors DST of the first string ST1 and the 2N-th string ST2N, among the strings included in the memory block MB. The N−1 second common drain selection lines C_DSL2 may commonly control drain selection transistors DST of adjacent strings ST2/ST3, ST4/ST5 . . . ST2N−2/ST2N−1, among the strings ST2 to ST2N−1 other than the first string ST1 and the 2N-th string ST2N. Therefore, during a program operation or a read operation, the drain selection transistors DST may be turned on or off depending on whether the first common drain selection line layer C_DSL1 and the N−1 second common drain selection line layers C_DSL2 are selected or not.

According to the above-described structure, during a program operation or a read operation, the memory cells MC of the first string ST1 and the 2N-th string ST2N that are disposed at the same level may be operated as a page PAGE_N. In addition, the memory cells MC of the adjacent strings ST2/ST3, ST4/ST5 . . . ST2N−2/ST2N−1 that are disposed at the same level may be operated as each page. For example, the memory cells MC of the second string ST2 and the third string ST3 that are disposed at the same level may be operated as another page PAGE_N+1.

A method of operating the semiconductor device according to the first embodiment of the present invention is shown in Table 1.

TABLE 1

|  | Selected or not | Read operation | Program operation |
|---|---|---|---|
| BL | Selected | 1 V | 0 V |
|  | Unselected | 0 V | Vcc |
| C_DSL1, C_DSL2 | Selected | Vcc | Vcc |
|  | Unselected | 0 V | 0 V |
| C_SSL | Selected | Vcc | 0 V |
| WL | Selected | Vread | Vpgm |
|  | Unselected | Vpass | Vpass |
| SL | Selected | 0 V | Vcc |
| PG | Selected | Vpass | Vpass |

During a read operation, a selected bit line BL may be precharged to a given level (1V), and an unselected bit line BL may be maintained at 0V. Here, an operating voltage Vcc may be applied to the common source selection line C_SSL to activate the common source selection line C_SSL. In addition, the operating voltage Vcc may be applied to activate selected common drain selection lines C_DSL1 and C_DSL2, and the unselected common drain selection lines C_DSL1 and C_DSL2 may be deactivated by grounding the unselected common drain selection lines C_DSL1 and C_DSL2.

A read voltage Vread may be applied to a selected word line WL. Here, the read voltage Vread may have a voltage level enough to turn on or off a memory cell transistor MC in response to data written into the memory cell transistor MC. In addition, a pass voltage Vpass may be applied to an unselected word line WL. Here, the pass voltage Vpass may have a voltage level enough to turn on the memory cell transistor MC regardless of the data written into the memory cell transistor MC.

A selected source line SL may be deactivated. The pass voltage Vpass may be applied to a selected pipe gate PG to turn on the pipe transistor PT.

During a program operation, the selected bit line BL may be maintained at 0V, and the operating voltage Vcc may be applied to the unselected bit line BL. Here, the common source selection line C_SSL may be deactivated by grounding the common source selection line C_SSL. In addition, the selected common drain selection lines C_DSL1 and C_DSL2 may be activated by applying the operating voltage Vcc to the selected common drain selection lines C_DSL1 and C_DSL2, while the unselected common drain selection lines C_DSL1 and C_DSL2 may be deactivated.

A program voltage Vpgm may be applied to the selected word line WL. In addition, the pass voltage Vpass may be applied to the unselected word line WL.

In addition, the selected source line SL may be activated by applying the operating voltage Vcc to the selected source line SL. The pass voltage Vpass may be applied to the selected pipe gate PG to turn on the pipe transistor PT.

Figure 4A:
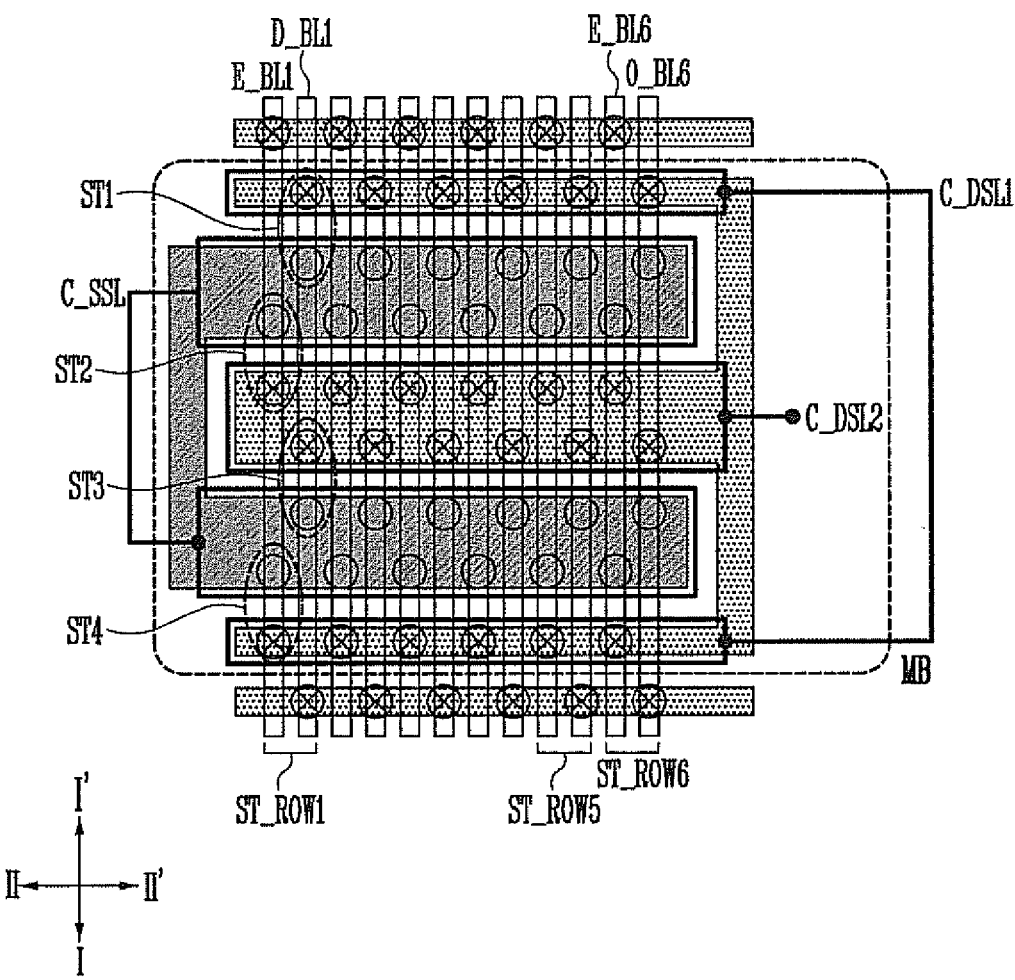
FIGS. 4A and 4B are views illustrating the structure of a semiconductor device according to a second embodiment of the present invention.
Figure 4B:
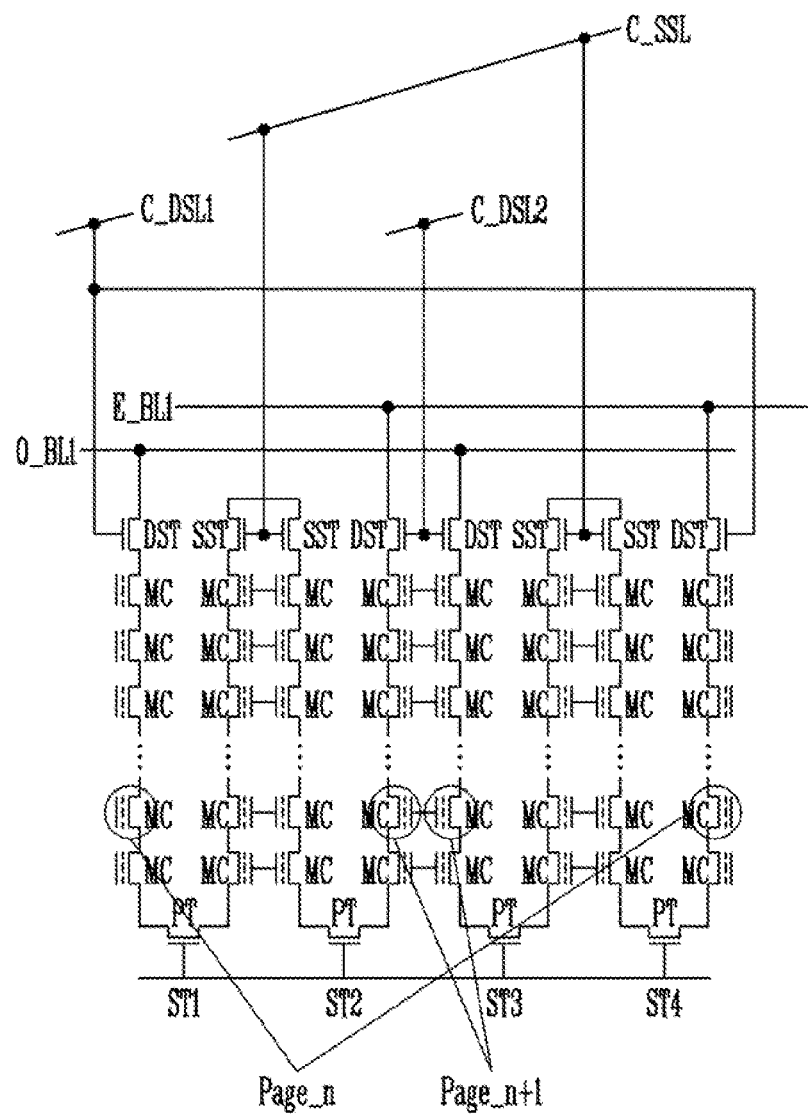

FIGS. 4A and 4B are views illustrating the structure of a semiconductor device according to a second embodiment of the present invention. FIG. 4A is a layout view of a cell array, and FIG. 4B is a circuit diagram of a portion of the cell array of FIG. 4A. Hereinafter, a description of the contents of the second embodiment the same as those of the first embodiment is omitted.

As shown in FIG. 4A, one of the memory blocks MB of the semiconductor device according to the second embodiment of the present invention may include six string rows ST_ROW1 to ST_ROW6. Each of the string rows ST_ROW1 to ST_ROW6 may include four strings ST1 to ST4.

As shown in FIG. 4B, source selection transistors SST of the strings ST1 to ST4, included in the memory block MB, may be controlled by one common source selection line C_SSL.

In addition, the drain selection transistors DST of the first string ST1 and the fourth string ST4, among the strings ST1 to ST4 included in the memory block MB, may be controlled by one first common drain selection line C_DSL1. In addition, the drain selection transistors DST of the second string ST2 and the third string ST3 may be commonly controlled by one second common drain selection line C_DSL2.

Therefore, during a program operation or a read operation, the memory cells MC of the first string ST1 and the fourth string ST4 that are disposed at the same level may be operated as a page PAGE_N. In addition, the memory cells MC of the second string ST2 and the third string ST3 that are disposed at the same level may be operated as another page PAGE_N+1.

The semiconductor device according to the second embodiment of the present invention may perform a program operation and a read operation under the same conditions as the semiconductor device according to the first embodiment.

Figure 5A:
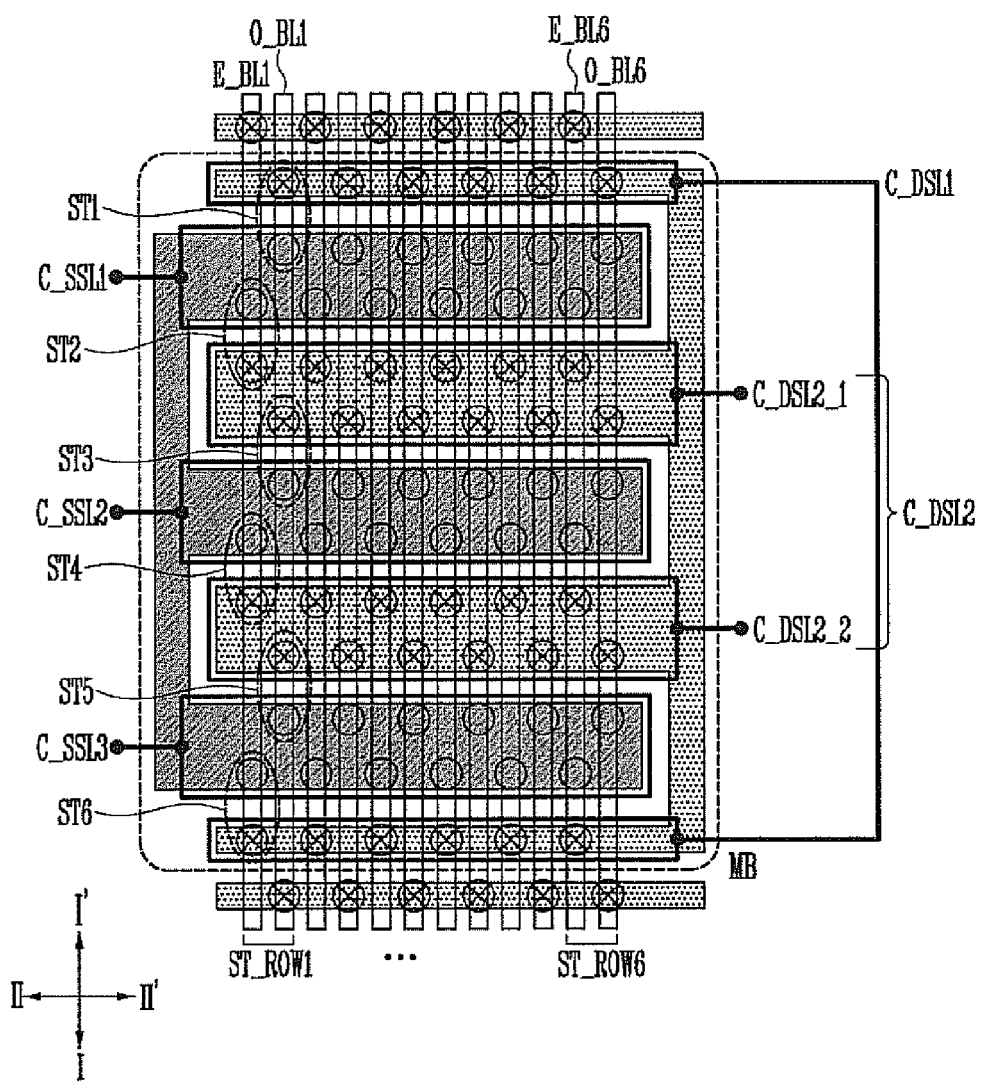
FIGS. 5A and 5B are views illustrating the structure of a semiconductor device according to a third embodiment of the present invention.
Figure 5B:
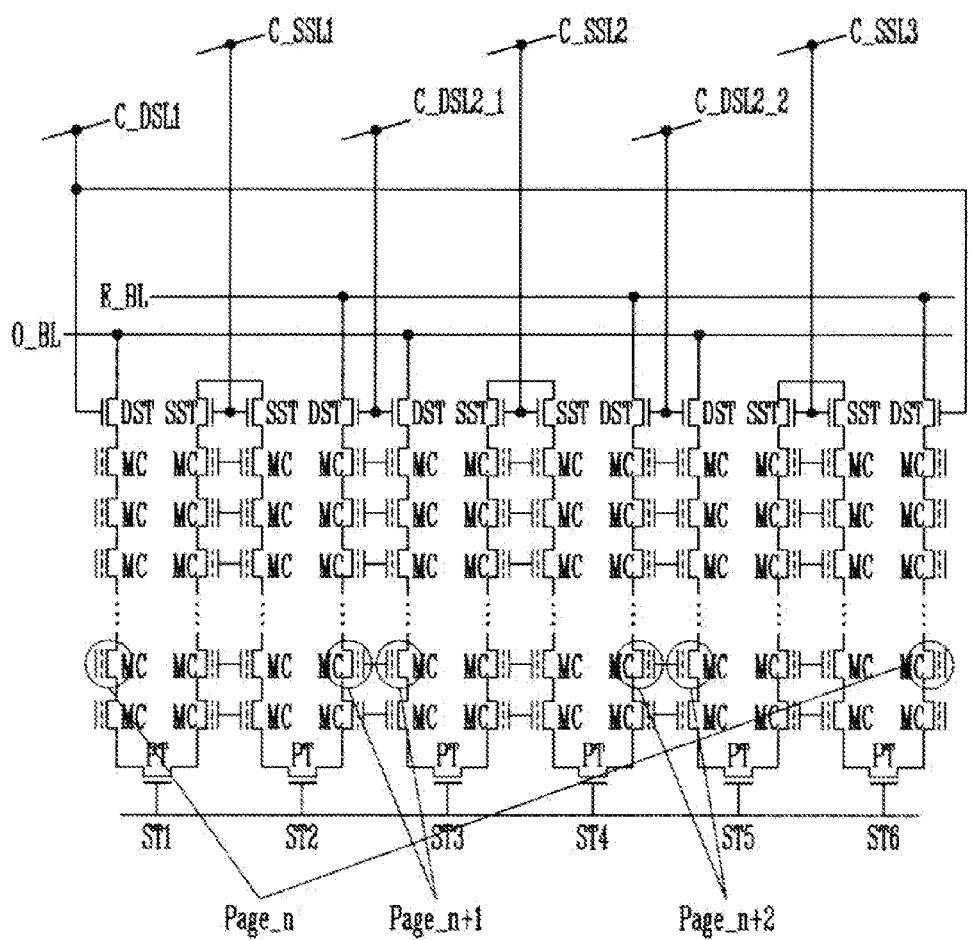

FIGS. 5A and 5b are views illustrating the structure of a semiconductor device according to a third embodiment of the present invention. FIG. 5A is a layout view of a cell array. FIG. 5B is a circuit diagram of a portion of the cell array of FIG. 5A. Hereinafter, a description of the contents of the third embodiment the same as those of the first embodiment is omitted.

As shown in FIG. 5A, one memory block MB of the semiconductor device according to the third embodiment of the present invention may include six string rows ST_ROW1 to ST_ROW6. Each of the string rows, for example, the string row ST_ROW1 may include six strings ST1 to ST6.

Here, common source selection line layers C_SSL1 to C_SSL3 that are disposed at the same level may have separate patterns and be separately operated. In particular, source selection transistors of adjacent strings ST1/ST2, ST3/ST4 and ST5/ST6, among the strings ST1 to ST6 included in the string row ST_ROW1, may be commonly controlled by the common source selection lines C_SSL1, C_SSL2 and C_SSL3, respectively.

As shown in FIG. 5B, the source selection transistors SST of the strings ST1 to ST6 included in the memory block MB may be controlled by the common source selection lines C_SSL1, C_SSL2 and C_SSL3. Therefore, the source selection transistors SST of the first and second strings ST1 and ST2 may be controlled by the common source selection line C_SSL1. The source selection transistors SST of the third and fourth strings ST3 and ST4 may be controlled by the common source selection line C_SSL2. The source selection transistors SST of the fifth and sixth strings ST5 and ST6 may be controlled by the common source selection line C_SSL3.

According to the above-described structure, during a program operation or a read operation, the memory cells MC of the first string ST1 and the sixth string ST6 that are disposed at the same level may be operated as a page PAGE_N. The memory cells MC of the second string ST2 and third string ST3 that are disposed at the same level may be operated as another page PAGE_N+1. The memory cells MC of the fourth string ST4 and the fifth string ST5 that are disposed at the same level may be operated as yet another page_N+2.

A method of operating the semiconductor device according to the third embodiment of the present invention is shown in Table 3.

TABLE 2

| | Selected or not | Read operation | Program operation |
|---|---|---|---|
| BL | Selected | 1 V | 0 V |
| | Unselected | 0 V | Vcc |
| C_DSL1, C_DSL2 | Selected | Vcc | Vcc |
| | Unselected | 0 V | 0 V |
| C_SSL1, CSSL2, C_SSL3 | Selected | Vcc | 0 V |
| | Unselected | 0 V | 0 V |
| WL | Selected | Vread | Vpgm |
| | Unselected | Vpass | Vpass |
| SL | Selected | 0 V | Vcc |
| PG | Selected | Vpass | Vpass |

During a read operation, the selected bit line BL may be precharged to a given level (1V), and the unselected bit line BL may be maintained at 0V. Here, the operating voltage Vcc may be applied to the selected common source selection lines C_SSL1 and C_SSL3 to activate the selected common source selection lines C_SSL1 and C_SSL3. The unselected common source selection line C_SSL2 may be deactivated. In addition, the selected common drain selection line C_DSL1 may be activated by applying the operating voltage Vcc to the selected common drain selection line C_DSL1. The unselected common drain selection lines C_DSL2_1 and C_DSL2_2 may be grounded so that the unselected common drain selection lines C_DSL2_1 and C_DSL2_2 may be deactivated.

The read voltage Vread may be applied to the selected word line WL. In addition, the pass voltage Vpass may be applied to the unselected word line WL.

In addition, the selected source line SL may be deactivated, and the pass voltage Vpass may be applied to the selected pipe gate PG to turn on the pipe transistor PT.

During a program operation, the selected bit line BL may be maintained at 0V, and the operating voltage Vcc may be applied to the unselected bit line BL. Here, the common source selection lines C_SSL1, C_SSL2 and C_SSL3 may all be grounded so that the common source selection lines C_SSL1, C_SSL2 and C_SSL3 may be deactivated. In addition, the selected common drain selection line C_DSL1 may be activated by applying the operating voltage Vcc to the selected common drain selection line C_DSL1. The unselected common drain selection lines C_DSL2_1 and C_DSL2_2 may be deactivated by grounding the unselected common drain selection lines C_DSL2_1 and C_DSL2_2.

The program voltage Vpgm may be applied to the selected word line WL. The pass voltage Vpass may be applied to the unselected word line WL.

In addition, the operating voltage Vcc may be applied to the selected source line SL, and the pass voltage Vpass may be applied to the selected pipe gate PG to turn on the pipe transistor PT.

Figure 6A:
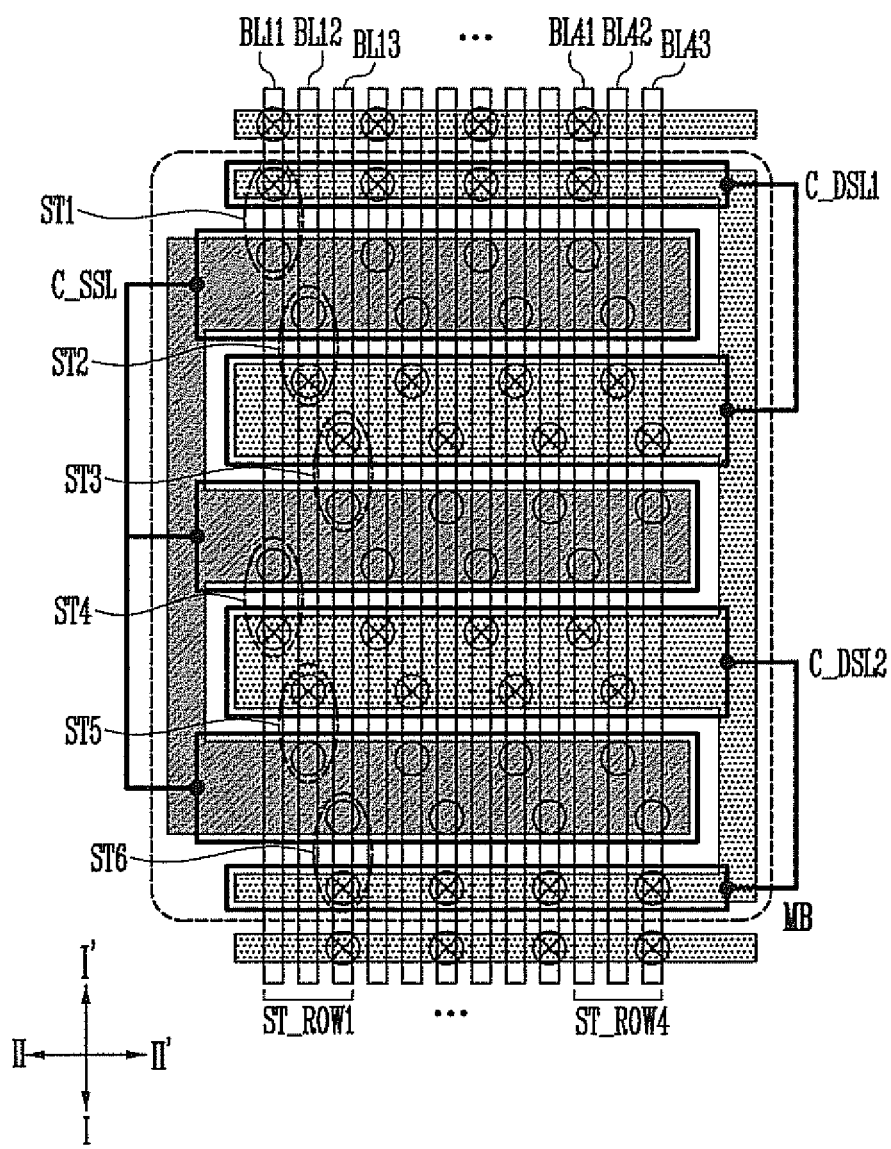
FIGS. 6A and 6B are views illustrating the structure of a semiconductor device according to a fourth embodiment of the present invention.
Figure 6B:
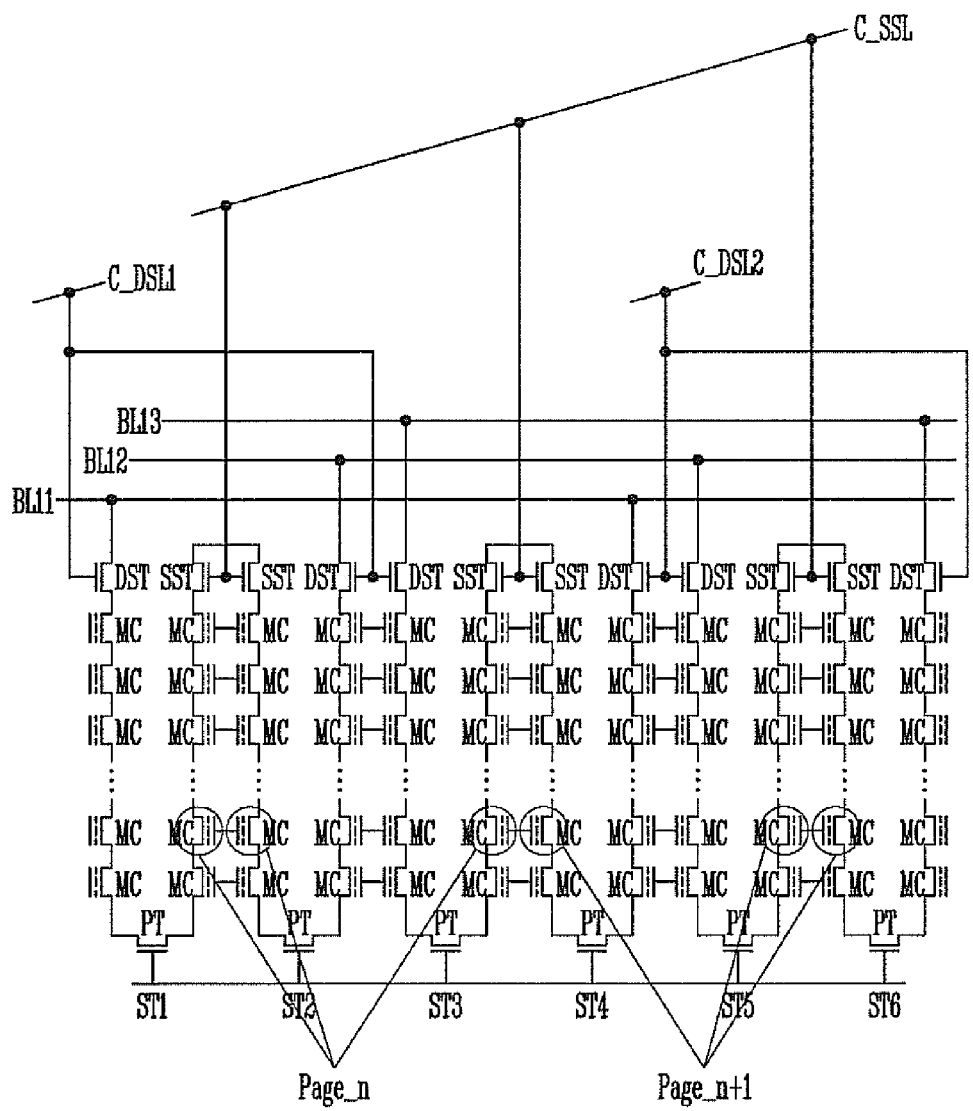

FIGS. 6A and 6B are views illustrating the structure of a semiconductor device according to a fourth embodiment of the present. FIG. 6A is a layout view of a cell array. FIG. 6B is a circuit diagram of a portion of the cell array of FIG. 6A. Hereinafter, a description of the contents of the fourth embodiment the same as those of the first embodiment is omitted.

As shown in FIG. 6A, one of the memory blocks MB of the memory device according to the fourth embodiment of the present invention may include four string rows ST_ROW1 to ST_ROW4. Each of the string rows ST_ROW1 to ST_ROW4 may include six strings ST1 to ST6.

In particular, according to the fourth embodiment, the first to sixth strings ST1 to ST6, included in the string row ST_ROW1, may be alternately coupled to first to third bit lines BL11 to BL13. Therefore, when first to sixth channel layers of the first to sixth strings ST1 to ST6 are arranged in a sequential manner, the first channel layer may be aligned with the fourth channel layer, the second channel layer may be aligned with the fifth channel layer to have an offset to the alignment of the first and fourth channel layers, and the third channel layer may be aligned with sixth channel layer to have an offset to the alignment of the first and fourth channel layers and the alignment of the second and fifth channel layers.

Here, one set of ends of common source selection line layers of the first to sixth strings ST1 to ST6 may be coupled to each other. In addition, one set of ends of common drain selection line layers of the first to third strings ST1 to ST3 may be coupled to each other. One set of ends of common drain selection line layers of the fourth to sixth strings ST4 to ST6 may be coupled to each other.

As shown in FIG. 6B, the string row ST_ROW1 may be coupled to three bit lines BL11, BL12 and BL13. For example, the first string ST1 and the fourth string ST4 may be coupled to the first bit line BL11. The second string ST2 and the fifth string ST5 may be coupled to the second bit line BL12. The third string ST3 and the sixth string ST6 may be coupled to the third bit line BL13.

According to the above-described structure, the source selection transistors SST of the strings ST1 to ST6 included in the memory block MB may be controlled by one common source selection line C_SSL. In addition, the first, second and third strings ST1, ST2 and ST3 coupled to the first, second and third bit lines BL11, BL12 and BL13, respectively, among the strings ST1 to ST6 included in the memory block MB, may be commonly controlled by the first common drain selection line layer C_DSL1. The fourth, fifth and sixth strings ST4, ST5 and ST6 coupled to the first, second and third bit lines BL11, BL12 and BL13, respectively, may be controlled by the second common drain selection line C_DSL2.

Therefore, during a program operation or a read operation, the memory cells MC of the first to third strings ST1 to ST3 that are disposed at the same level may be operated as a page PAGE_N, and the memory cells MC of the fourth to sixth strings ST4 to ST6 that are disposed at the same level may be operated as another page PAGE_N+1.

The semiconductor device according to the fourth embodiment of the present invention may perform a program operation and a read operation under the same conditions as the semiconductor according to the first embodiment of the present invention.

Figure 7:
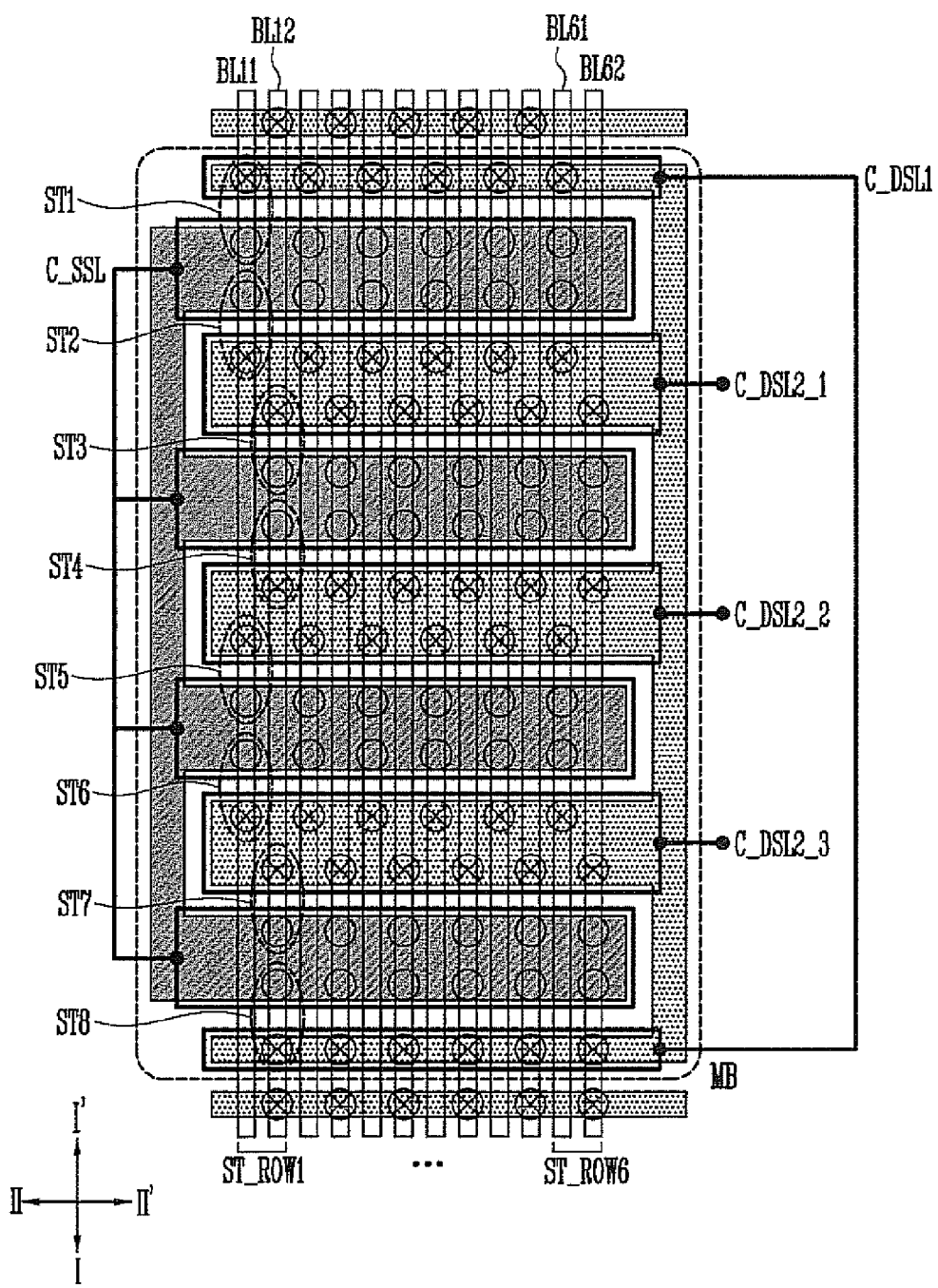
FIG. 7 is a layout view of a cell array of a semiconductor device according to a fifth embodiment of the present invention.

FIG. 7 is a layout view of a cell array of a semiconductor device according to a fifth embodiment of the present invention.

As shown in FIG. 7, the semiconductor device according to the fifth embodiment of the present invention may include six string rows ST_ROW1 to ST_ROW6 that extend in the first direction I-I'. In addition, each of the six string rows, for example, a string row ST_ROW1 may include eight strings ST1 to ST8.

Here, the strings ST1 to ST8 included in the string row ST_ROW1 may be grouped into pairs and coupled to two bit lines BL11 and BL12. In particular, according to the fifth embodiment, the strings ST1/ST2, ST3/ST4, ST5/ST6 and ST7/ST8, each of which share the same source line SL, may be aligned with each other. The strings that share common drain selection lines C_DSL1, C_DSL2_1, C_DSL2_2 and C_DSL2_3 may be coupled to different bit lines BL11 and BL12.

In this case, the strings aligned with each other may be coupled to the same bit line. More specifically, the first, second, fifth and sixth strings ST1, ST2, ST5 and ST6 may be coupled to the first bit line BL11, and the third, fourth, seventh and eighth strings ST3, ST4, ST7 and ST8 may be coupled to the second bit line BL12.

The semiconductor device according to the fifth embodiment of the present invention may perform a program operation and a read operation under the same conditions as the semiconductor device according to the first embodiment of the present invention.

Figure 8:
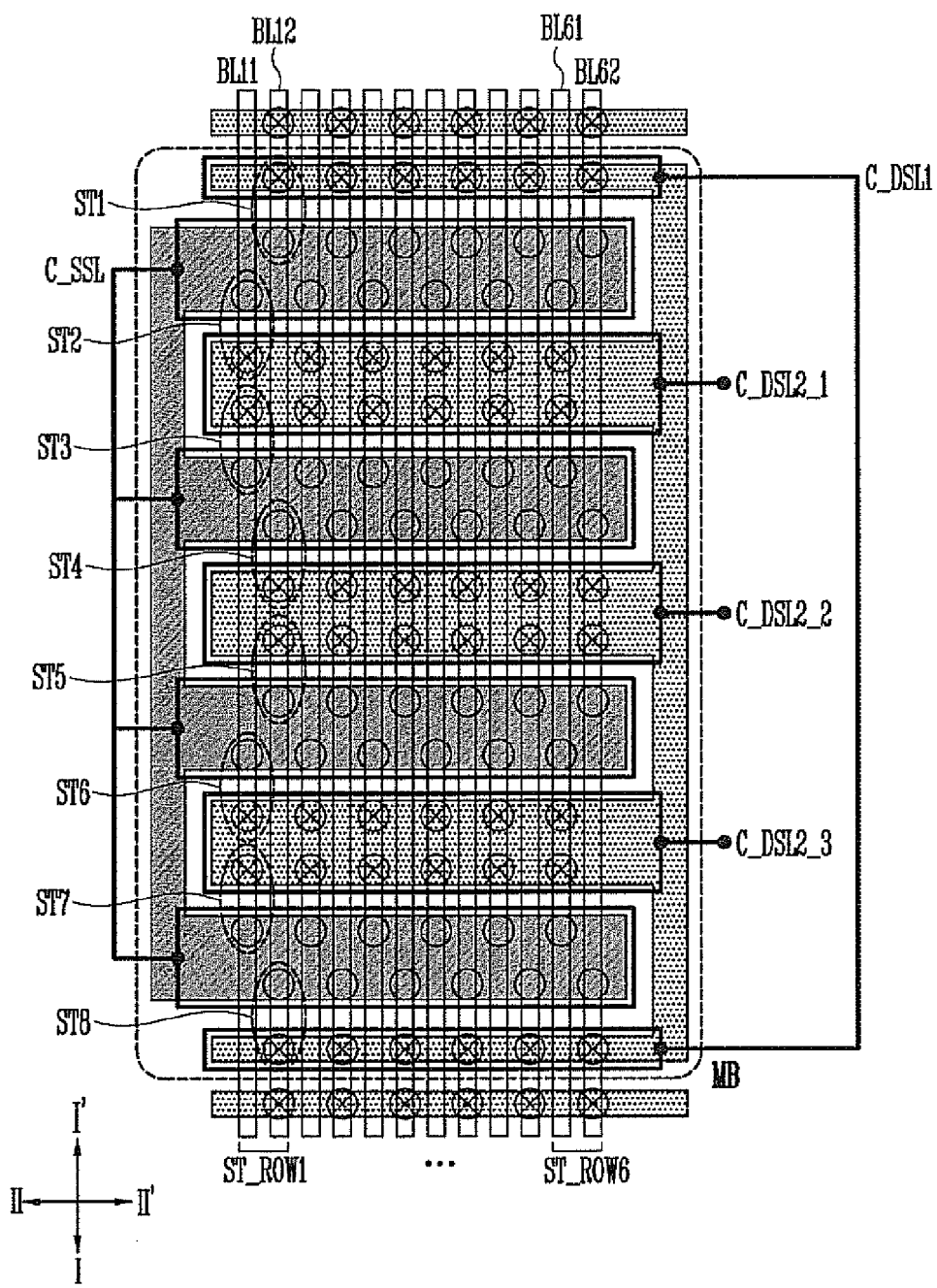
FIG. 8 is a layout view of a cell array of a semiconductor device according to a sixth embodiment of the present invention.

FIG. 8 is a layout view of a cell array of a semiconductor device according to a sixth embodiment of the present invention.

As shown in FIG. 8, the semiconductor device according to the sixth embodiment of the present invention may include sixth string rows ST_ROW1 to ST_ROW6 that extend in the first direction I-I'. In addition, each of the string rows, for example, the string row ST_ROW1 may include eight strings ST1 to ST8.

Here, the strings ST1 to ST8 included in the string row ST_ROW1 may be grouped into pairs and coupled to two bit lines BL11 and BL12. In particular, according to the sixth embodiment, the strings that share the same source line SL may be coupled to different bit lines BL11 and BL12. The strings ST1/ST8, ST2/ST3, ST4/ST5 and ST6/ST7 that share the common drain selection lines C_DSL1, C_DSL2_1, C_DSL2_2 and C_DSL2_3, respectively, may be aligned with each other.

For example, as for the second to seventh strings ST2 to ST7 except for the first string ST1 and the eighth string ST8 located at the edges of the memory block, two consecutive strings ST2/ST3, ST4/ST5 or ST6/ST7 may form a single group to be coupled to the same bit line. Therefore, the second, third, sixth and seventh strings ST2, ST3, ST6 and ST7 may be coupled to the first bit line BL11. The first, fourth, fifth and eighth strings ST1, ST4, ST5 and ST8 may be coupled to the second bit line BL12.

The semiconductor device according to the sixth embodiment of the present invention may perform a program operation and a read operation under the same conditions as the semiconductor device according to the first embodiment of the present invention.

Figure 9:
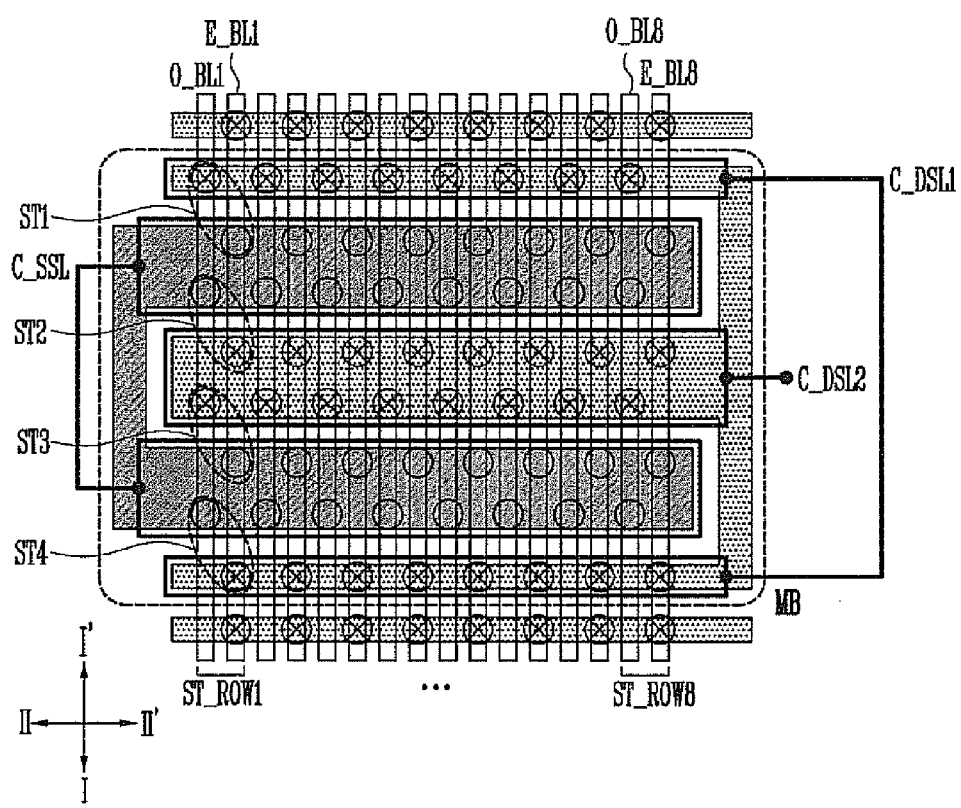
FIG. 9 is a layout view of a cell array of a semiconductor device according to a seventh embodiment of the present invention.

FIG. 9 is a layout view of a cell array of a semiconductor device according to a seventh embodiment of the present invention.

As shown in FIG. 9, the semiconductor device according to the seventh embodiment of the present invention may include eight string rows ST_ROW1 to ST_ROW8 that extend in the first direction In addition, each of the string rows, for example, the string row ST_ROW1, may include four strings ST1 to ST4.

Subsequently, the strings ST1 to ST4 included in the string row ST_ROW1 may have the central axes at an angle with respect to the bit lines BL. The strings ST1 to ST4 may be coupled to two bit lines O_BL1 and E_BL1. In particular, in the seventh embodiment, even strings ST2 and ST4, among the strings ST1 to ST4 included in the string row ST_ROW1, may be coupled to the even bit line E_BL1. Odd strings ST1 and ST3 may be coupled to the odd bit line O_BL1.

For example, the first and third strings ST1 and ST3 may be coupled to the odd bit line O_BL1, and the second and fourth strings ST2 and ST4 may be coupled to the even bit line E_BL1.

The semiconductor device according to the seventh embodiment of the present invention may perform a program operation and a read operation under the same conditions as the semiconductor device according to the first embodiment of the present invention.

Figure 10:
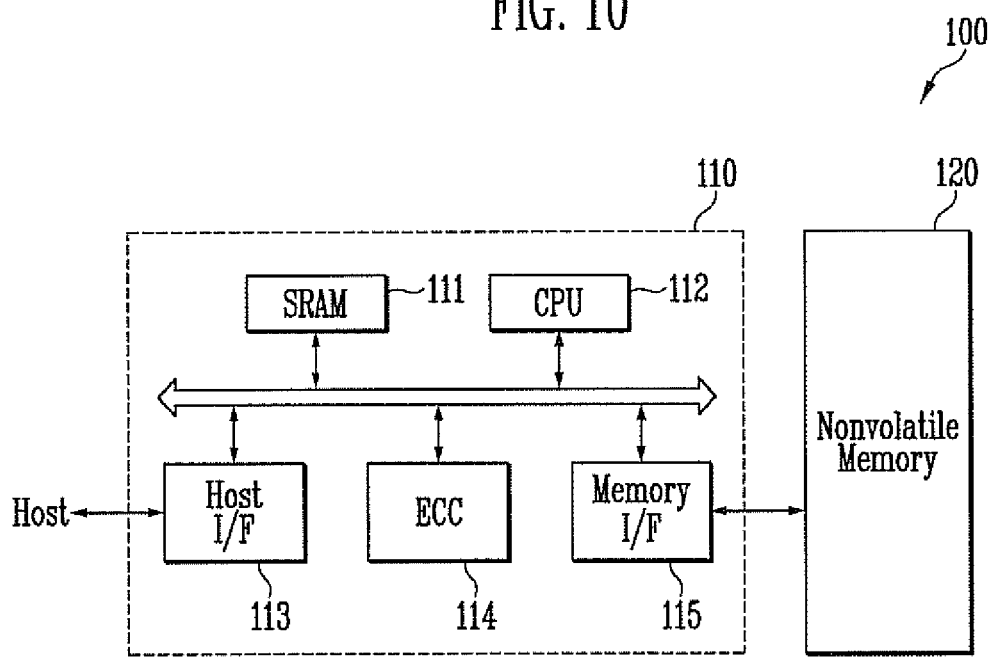
FIG. 10 is a view illustrating the configuration of a memory system according to an embodiment of the present invention.

FIG. 10 is a view illustrating the configuration of a memory system according to an embodiment of the present invention.

As shown in FIG. 10, a memory system 100 according to an embodiment of the present invention may include a non-volatile memory device 120 and a memory controller 110.

The non-volatile memory device 120 may have the cell array described in connection with the first to seventh embodiments. In addition, the non-volatile memory device 120 may be a multi-chip package composed of a plurality of flash memory chips.

The memory controller 110 may be configured to control the non-volatile memory device 120. The memory controller 110 may include SRAM 111, a CPU 112, a host interface 113, an ECC 114 and a memory interface 115. The SRAM 111 may serve as an operation memory of the CPU 112. The CPU 112 may perform the general control operation for data exchange of the memory controller 110. The host interface 113 may include a data exchange protocol of a host coupled to the memory system 100. In addition, the ECC 114 may detect and correct errors included in data read from the non-volatile memory device 120. The memory interface 115 may perform to interface with the non-volatile memory device 120. The memory controller 110 may further include RCM that stores code data to interface with the host.

The memory system 100 having the above-described configuration may be a solid state disk (SSD) or a memory card in which the memory device 120 and the memory controller 110 are combined. For example, when the memory system 100 is an SSD, the memory controller 110 may communicate with the outside (e.g., a host) through one of the interface protocols including USB, MMC, PCI-E, SATA, PATA, SCSI, ESDI and IDE.

Figure 11:
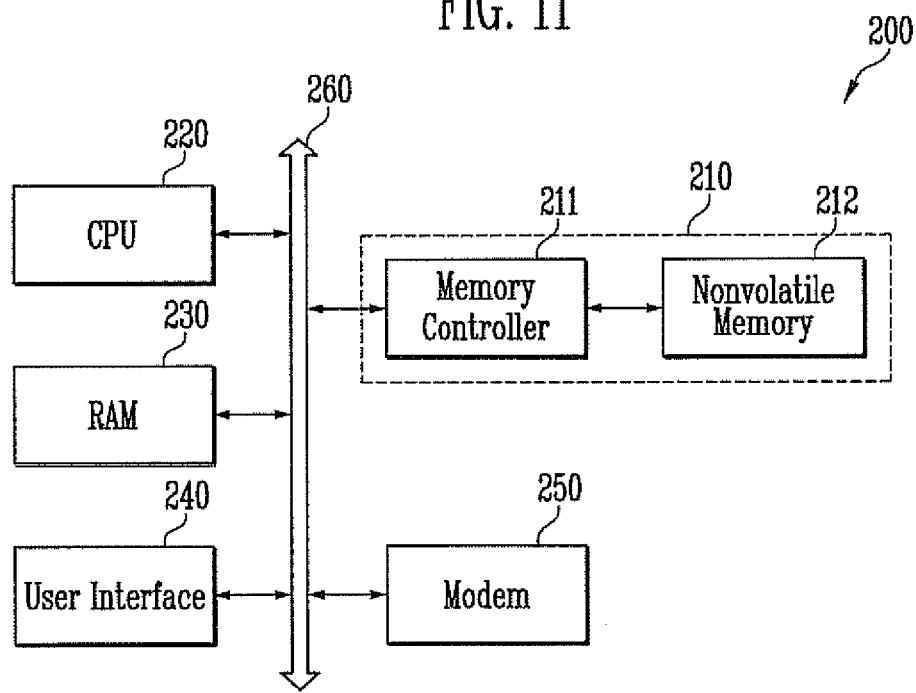
FIG. 11 is a view illustrating the configuration of a computing system according to an embodiment of the present invention.

FIG. 11 is a view illustrating the configuration of a computing system according to an embodiment of the present invention.

As shown in FIG. 11, a computing system 200 according to an embodiment of the present invention may include a CPU 220, RAM 230, a user interface 240, a modem 250, and a memory system 210 that are electrically coupled to a system bus 260. In addition, when the computing system 200 is a mobile device, a battery may be further included to apply operating voltage to the computing system 200. The computing system 200 may further include application chipsets, a Camera Image Processor (CIS) and mobile DRAM.

As described above with reference to FIG. 10, the memory system 210 may include a non-volatile memory 212 and a memory controller 211.

According to embodiments of the present invention, a semiconductor device may include common source selection lines that commonly control source selection transistors of adjacent strings among strings, included in a single string row, and common drain selection lines that commonly control drain selection transistors of at least two of the strings included in the string row. Therefore, cell area may be reduced, and stacked layers may be prevented from leaning. In addition, since drain selection lines located at boundaries of adjacent memory blocks are separated, memory cells may be easily operated on each memory block.

What is claimed is:
1. A three-dimensional (3-D) non-volatile memory device, comprising:
   a plurality of bit lines;

at least one string row extending in a first direction coupled to the bit lines and including 2N strings, wherein the N includes a natural number;

a common source selection line configured to control source selection transistors of the 2N strings included in a memory block;

a first common drain selection line configured to control drain selection transistors of a first string and a 2N-th string among the 2N strings included in a memory block; and N−1 second common drain selection lines configured to control drain selection transistors of adjacent strings in the first direction among remaining strings other than the first string and the 2N-th string.

2. The 3-D non-volatile memory device of claim 1, wherein in a read operation, the common source selection line is activated, and a selected common drain selection line among the first and second common drain selection lines is activated while unselected common drain selection lines are deactivated.

3. The 3-D non-volatile memory device of claim 1, wherein in a program operation, the common source selection line is deactivated, and a selected common drain selection line among the first and second common drain selection lines is activated while unselected common drain selection lines are deactivated.

4. A three-dimensional (3-D) non-volatile memory device, comprising:

a plurality of bit lines;

at least one string row including a plurality of strings and coupled to the bit lines;

a plurality of common source selection lines coupled to gates of source selection transistors of adjacent strings pairs among the plurality of strings included in the string row; and a plurality of common drain selection lines coupled gates of to drain selection transistors of at least two of the plurality of strings included in the string row.

5. The 3-D non-volatile memory device of claim 4, wherein the same voltage is applied to the plurality of common source selection lines.

6. The 3-D non-volatile memory device of claim 5, wherein in a read operation, the plurality of common source selection lines are activated, and a selected common drain selection line among the plurality of common drain selection lines is activated while unselected common drain selection lines are deactivated.

7. The 3-D non-volatile memory device of claim 5, wherein in a program operation, the plurality of common source selection lines are deactivated, and a selected common drain selection line among the plurality of common drain selection lines is activated while unselected common drain selection lines are deactivated.

8. The 3-D non-volatile memory device of claim 4, wherein the string row includes 2N strings, wherein the N includes a natural number, and the common drain selection lines include:

a first common drain selection line coupled drain selection transistors of a first string and a 2N-th string among the 2N strings included in the string row; and N−1 second common drain selection lines coupled to drain selection transistors of adjacent strings among remaining strings other than the first string and the 2N-th string.

9. The 3-D non-volatile memory device of claim 8, wherein in a read operation, selected common source selection lines among the plurality of common source selection lines are activated while unselected common source selection lines are deactivated, and a selected common drain selection line among the first and second common drain selection lines is activated while unselected common drain selection lines are deactivated.

10. The 3-D non-volatile memory device of claim 8, wherein in a program operation, the plurality of common source selection lines are deactivated, and a selected common drain selection line among the first and second common drain selection lines is activated while unselected common drain selection lines are deactivated.

11. The 3-D non-volatile memory device of claim 4, wherein the string row includes 6 strings, and the common drain selection lines include:

a first common drain selection line coupled to drain selection transistors of first to third strings among the first to sixth strings included in the string row; and a second common drain selection line coupled to drain selection transistors of fourth to sixth strings.

12. The 3-D non-volatile memory device of claim 11, wherein in a read operation, the plurality of common source selection lines are activated, and a selected common drain selection line among the first and second common drain selection lines is activated while an unselected common drain selection line is deactivated.

13. The 3-D non-volatile memory device of claim 11, wherein in a program operation, the plurality of common source selection lines are deactivated, and a selected common drain selection line among the first and second common drain selection lines is activated while an unselected common drain selection line is deactivated.

14. The 3-D non-volatile memory device of claim 4, wherein the memory device includes a plurality of memory blocks each including the string row.

15. A three-dimensional (3-D) non-volatile memory device, comprising:

channel layers each including a pipe channel layer and a pair of a source side channel layer and a drain side channel layer coupled to the pipe channel layer, wherein the channel layers are arranged in a first direction and a second direction crossing the first direction to have the source and drain side channel layers thereof adjacent to source and drain side channel layers of adjacent channel layers, respectively;

common source selection line layers surrounding adjacent source side channel layers, among the source side channel layers of the channel layers, wherein the common source selection line layers are formed in at least one level;

first common drain selection line layers surrounding drain side channel layers of the channel layers located at edges of a memory block, wherein the common drain selection line layers are formed in at least one level; and second common drain selection line layers surrounding adjacent drain side channel layers, among the drain side channel layers of the channel layers, other than the drain side channel layers located at the edges of the memory block, wherein the second common drain selection line layers are formed in at least one level.

16. The 3-D non-volatile memory device of claim 15, further comprising a plurality of bit lines extending in the first direction and coupled to the channel layers wherein centers of the adjacent channel layers arranged in the first direction are offset in the second direction.

17. The 3-D non-volatile memory device of claim 15, wherein channel layers arranged in the first direction have the central axes at an angle to the first direction.

18. The 3-D non-volatile memory device of claim 15, wherein one set of ends of the common source selection line layers formed at the same level are coupled to each other.

19. The 3-D non-volatile memory device of claim 18, wherein in a read operation, an operating voltage is applied to the common source selection line layers, and the operating voltage is applied to a selected common drain selection line layer among the first and second common drain selection line layers while unselected common drain selection line layers are grounded.

20. The 3-D non-volatile memory device of claim 18, wherein in a program operation, the common source selection line layers are grounded, and an operating voltage is applied to a selected common drain selection line layer among the first and second common drain selection line layers while unselected common drain selection line layers are grounded.

21. The 3-D non-volatile memory device of claim 15, wherein the common source selection line layers formed at the same level are separated from each other.

22. The 3-D non-volatile memory device of claim 21, wherein in a read operation, an operating voltage is applied to selected common source selection line layers among the common source selection line layers while unselected common source selection line layers are grounded, and the operating voltage is applied to a selected common drain selection line layer among the first and second common drain selection line layers while unselected common drain selection line layers are grounded.

23. The 3-D non-volatile memory device of claim 21, wherein in a program operation, the common source selection line layers are grounded, and an operating voltage is applied to a selected common drain selection line layer among the first and second common drain selection line layers while unselected common drain selection line layers are grounded.

* * * * *